US010409923B2

(12) United States Patent
Germain et al.

(10) Patent No.: US 10,409,923 B2
(45) Date of Patent: Sep. 10, 2019

(54) SYNCHRONIZATION OF VARIOUS COMPUTER MODELS OF OILFIELD NETWORKS

(71) Applicant: LANDMARK GRAPHICS CORPORATION, Houston, TX (US)

(72) Inventors: Olivier R. Germain, Houston, TX (US); Mark Lochmann, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 126 days.

(21) Appl. No.: 15/114,350

(22) PCT Filed: Feb. 26, 2014

(86) PCT No.: PCT/US2014/018511
§ 371 (c)(1),
(2) Date: Jul. 26, 2016

(87) PCT Pub. No.: WO2015/130269
PCT Pub. Date: Sep. 3, 2015

(65) Prior Publication Data
US 2017/0235854 A1      Aug. 17, 2017

(51) Int. Cl.
*G06Q 10/04* (2012.01)
*G06F 17/50* (2006.01)
(Continued)

(52) U.S. Cl.
CPC ............ *G06F 17/5004* (2013.01); *E21B 7/00* (2013.01); *E21B 41/0092* (2013.01); *G06Q 10/04* (2013.01)

(58) Field of Classification Search
CPC .......... E21B 47/00; E21B 43/12; E21B 49/00; E21B 47/10; E21B 43/00; E21B 41/0035;
(Continued)

(56) References Cited

U.S. PATENT DOCUMENTS 6,028,819 A      2/2000   Mullarkey et al.
6,619,393 B1 *   9/2003   Olivera ................... E21B 43/30
                                                           166/245
(Continued)

FOREIGN PATENT DOCUMENTS

CA          2674601          7/2008

OTHER PUBLICATIONS

PCT Search Report for PCT Application No. PCT/US14/18511 dated Nov. 26, 2014.
(Continued)

*Primary Examiner* — Kamini S Shah
*Assistant Examiner* — Faraj Ayoub
(74) *Attorney, Agent, or Firm* — Locke Lord LLP

(57) ABSTRACT

A method of modeling an oilfield network can include identifying a well and a tying point, identifying locations of the well and tying point, identifying elevations of the well and tying point, creating a model pipeline along a path between the well and the tying point, such as a straight line path between the well and the tying point, defining a length of the path, calculating an elevation difference between the well and the tying point, determining whether an obstacle exists in the path, and defining a length of the pipeline. A method can include creating a second path that circumvents the obstacle and adjusting a length of a pipeline accordingly. A method can include implementing one or more nudging algorithms and incrementally adjusting the length of a pipeline. A method can include defining one or more limits for adjusting a length of a pipeline model.

15 Claims, 8 Drawing Sheets

(51) Int. Cl.
   *E21B 41/00* (2006.01)
   *E21B 7/00* (2006.01)
(58) Field of Classification Search
   CPC .. E21B 43/25; G06F 17/5009; G06F 2217/16; G06F 2217/34
   USPC .......................................................... 703/10
   See application file for complete search history.

(56) References Cited

U.S. PATENT DOCUMENTS

| | | | |
|---|---|---|---|
| 8,229,938 B2 | 7/2012 | Bal et al. | |
| 2004/0054475 A1* | 3/2004 | Grace | G06T 17/20 702/1 |
| 2009/0056935 A1 | 3/2009 | Prange et al. | |
| 2009/0089028 A1 | 4/2009 | Sagert et al. | |
| 2009/0200014 A1* | 8/2009 | Schottle | E21B 7/06 166/245 |
| 2011/0022435 A1 | 1/2011 | Reid et al. | |
| 2012/0016649 A1* | 1/2012 | Thambynayagam | E21B 43/12 703/10 |
| 2013/0140037 A1* | 6/2013 | Sequeira, Jr. | E21B 7/04 166/369 |
| 2013/0246032 A1 | 9/2013 | El-Bakry et al. | |
| 2014/0172382 A1* | 6/2014 | Andrews | G06F 17/5009 703/2 |

OTHER PUBLICATIONS

PCT Written Opinion for PCT Application No. PCT/US14/18511 dated Nov. 26, 2014.
EP Extended Search Report for EP 14883945 dated Jul. 13, 2017.
Canadian Office Action Report for Canadian Application 2936625 dated Apr. 24, 2018.

* cited by examiner

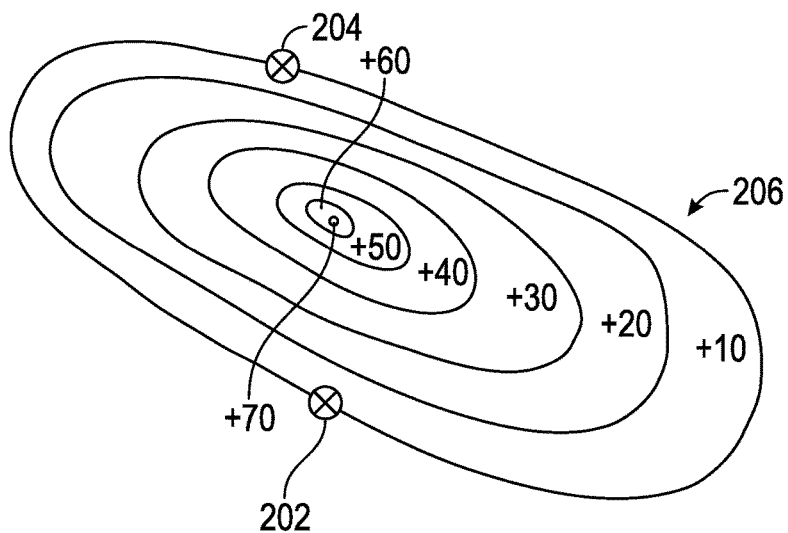
FIG. 8
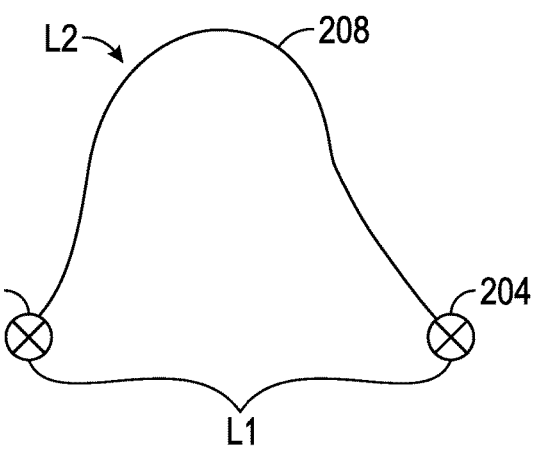
FIG. 9
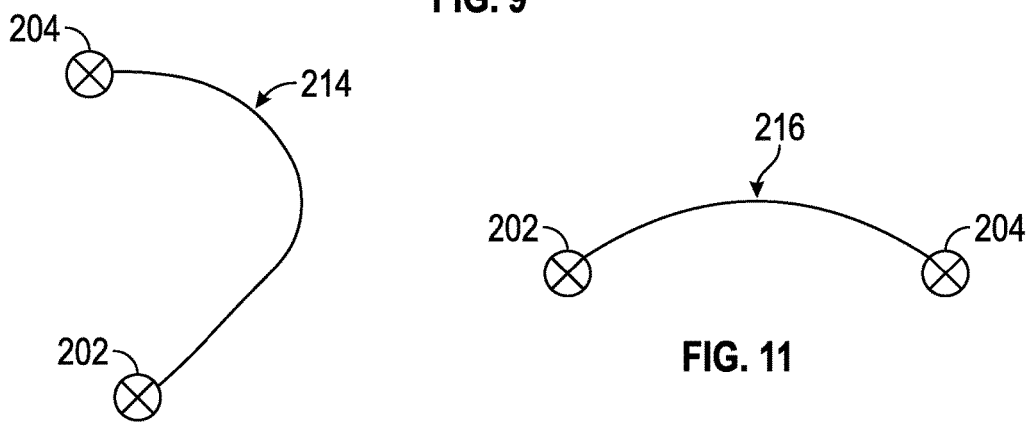
FIG. 10
FIG. 11

SYNCHRONIZATION OF VARIOUS COMPUTER MODELS OF OILFIELD NETWORKS

FIELD OF INVENTION

The embodiments disclosed herein relate generally to modeling oilfield networks, and more specifically relate to methods and systems for creating production engineering and allocation networks.

BACKGROUND OF INVENTION

A production engineering network is a computer representation of the physical reality of an oilfield network that is used by oilfield operators to calculate hydraulic flows and predict events and conditions such as pipeline bottlenecks, compressor underutilization or flaring overflow. To maximize its accuracy and usefulness, a production engineering network model should be kept current, with the computer representation synchronized with the actual physical network on the ground. This is a time consuming effort, which requires considerable manual entry from sources such as "as built" drawings that may be difficult to obtain if the oilfield network is run by different operators. Therefore, synchronization may not be performed as often as required to keep the production engineering network current with the actual physical network. This is especially true for rapidly changing networks, such as coal bed methane or shale gas, where a new well may be drilled and added to the physical network in as little as a week or even less. If the production engineering network is not kept current, then performance models could fall behind and under-optimization may result.

Besides production engineering networks, oilfield operators may also use other computer models and databases to operate and record information regarding an oilfield network. Production allocation networks are another representation of the physical network, but unlike production engineering networks, production allocation networks are used to track the sources of production from the wells all the way back down to the individual reservoirs. Thus they are used primarily on the financial side of the operation. A production allocation network may not contain all the information that would be provided in a production engineering network, but because of regulatory compliance and other business considerations, the production allocation networks are normally kept up to date as each new well comes online and starts producing. Therefore, there is a need for methods and systems to improve the synchronization of production engineering networks.

BRIEF DESCRIPTION OF DRAWINGS

FIG. 8 is a schematic top view of the exemplary application of a nudging algorithm of FIG. 7.

FIG. 9 is a schematic side view of the exemplary application of a nudging algorithm of FIGS. 7-8.

FIG. 10 is a schematic top view of the exemplary application of a nudging algorithm of FIGS. 7-9.

FIG. 11 is a schematic side view of the exemplary application of a nudging algorithm of FIGS. 7-10.

DETAILED DESCRIPTION OF DISCLOSED EMBODIMENTS

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure. It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the disclosure.

This disclosure provides systems and methods for modeling oilfield networks, which can include wholly or partially combining one or more production engineering networks and one or more production allocation networks (including any portion of any of them). In at least one embodiment, a production engineering network and a production allocation network relating to the same physical asset(s) can be combined to create a combined network model. In at least one other embodiment, a production allocation network can be converted into a production engineering network, or vice versa.

Figure 1:
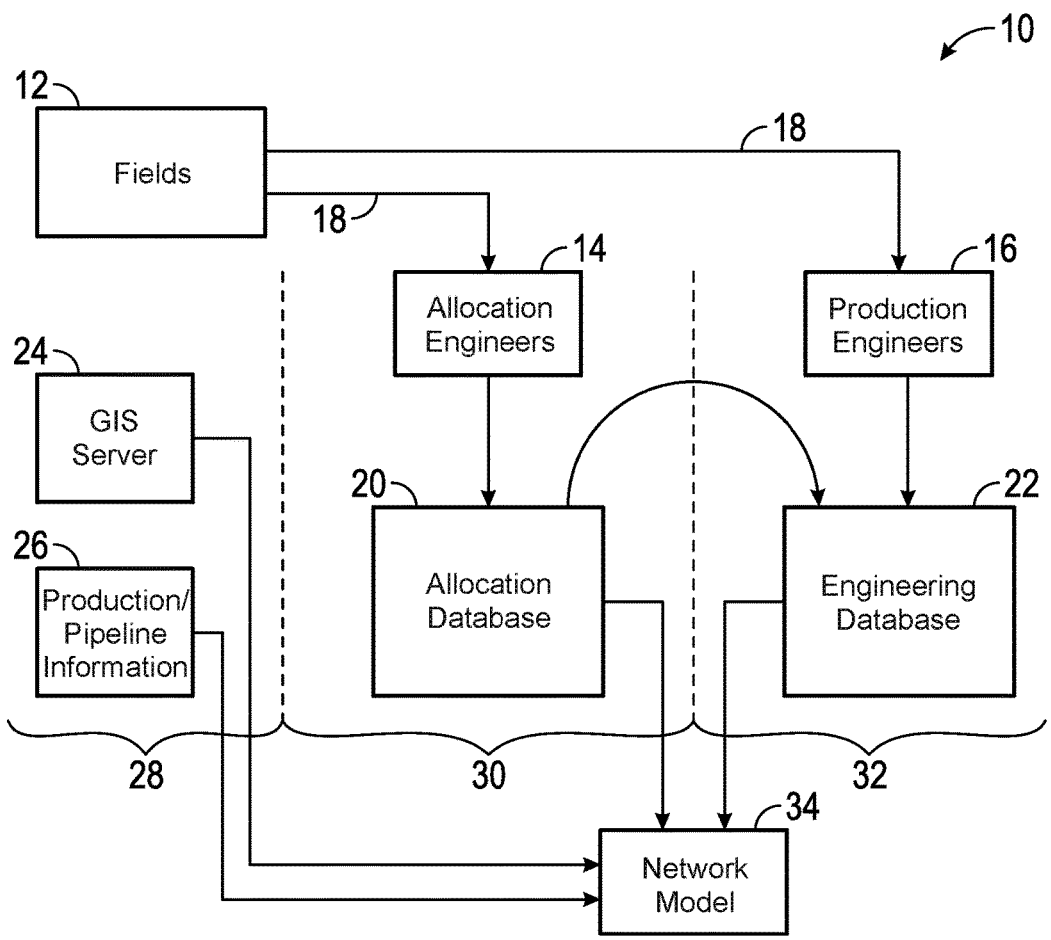
FIG. 1 is a schematic diagram illustrating a physical implementation of one of many embodiments of a network model according to the disclosure.
Figure 2:
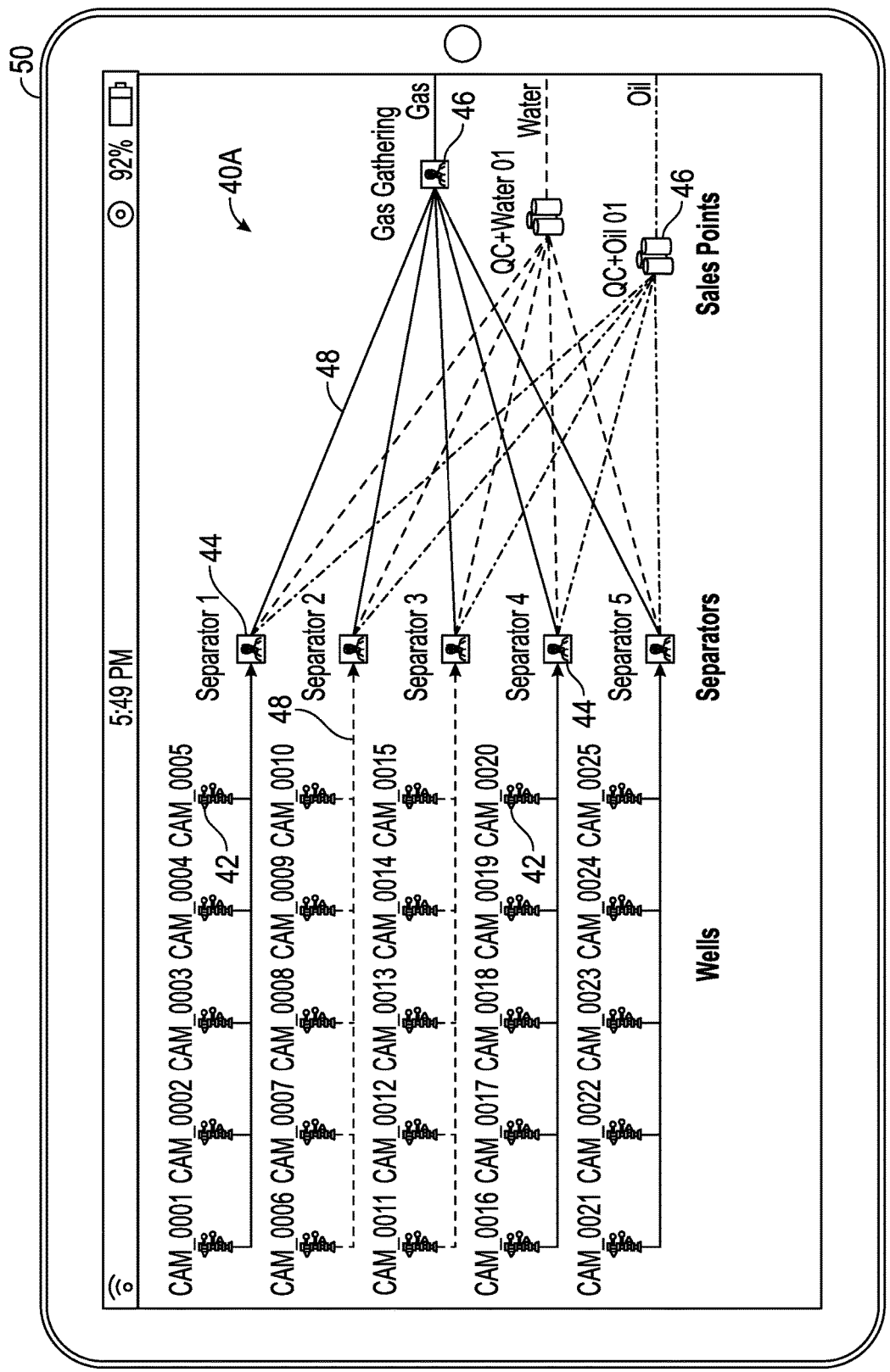
FIG. 2 is a schematic diagram illustrating a one of many embodiments of an allocation network according to the disclosure.
Figure 3:
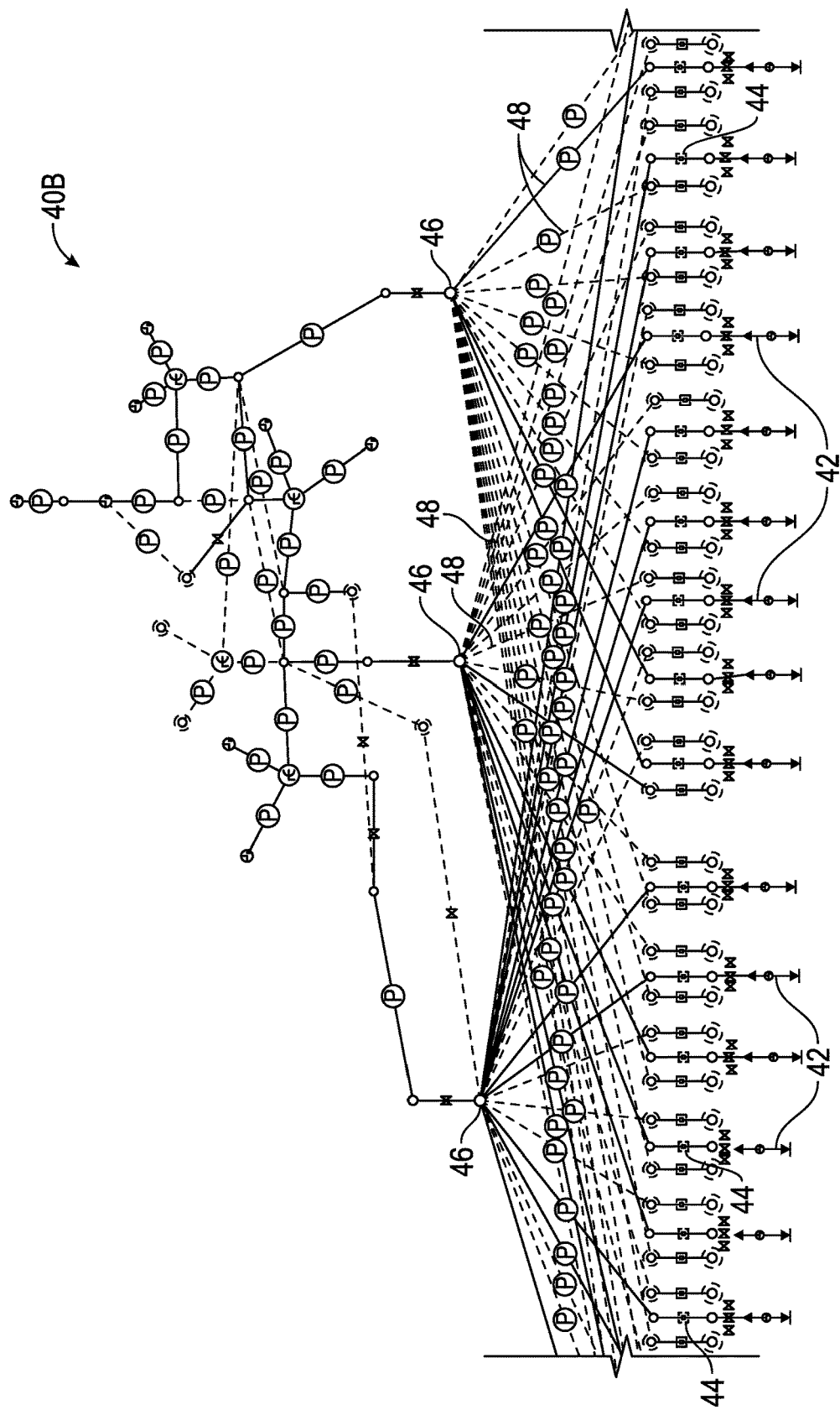
FIG. 3 is a schematic diagram illustrating another of many embodiments of an allocation network according to the disclosure.

FIG. 1 is a schematic diagram illustrating a physical implementation of one of many embodiments of a network model according to the disclosure. FIG. 2 is a schematic diagram illustrating a one of many embodiments of an allocation network according to the disclosure. FIG. 3 is a schematic diagram illustrating another of many embodiments of an allocation network according to the disclosure. FIGS. 1-3 will be described in conjunction with one another. A physical oilfield network 10 can include any number of components for production and allocation of oil, gas, water and/or other fluids from one or more wellbore or wellbore systems. As shown, for example, in FIG. 1, for illustrative purposes, a network 10 can include one or more fields 12, which may include components for producing and moving fluids, such as wellbores and associated production equipment, oilfield facilities, linkage or links (e.g., pipes or pipelines) and the like. Information regarding field 12, such as production and allocation information, can be monitored and/or collected and can be used by personnel for various commercial and other purposes, such as to optimize or predict production, to allocate or market production materials or as other examples, for purposes of managing financial or operations considerations. Such information, or relevant portions thereof, can be retrieved or otherwise obtained by one or more persons, such as an allocation engineer 14 or production engineer 16, and may be stored on servers or other applicable media. For example, periodic or other updates 18 relating to field 12 can be routed to or collected by relevant personnel and stored or incorporated in one or more databases, such as an allocation database 20 or a production engineering database 22. In an allocation database, data may be incorporated into one or more models (see FIGS. 2-3), such as allocation network models 40A, 40B (which may also be referred to as "allocation networks" for simplicity). In a production (or production engineering) database, data may be incorporated into one or more other models, such as production engineering network models (not shown). Allocation and production engineering networks are described in greater detail below, but generally may include a plurality of tying points, such as, for example, wells 42, separators 44, sales facilities 46 and/or other facilities or components, tied (or linked) together with one or more communication paths, such as pipelines 48. Other information relating to one or more fields 12 may be located elsewhere, which can include any public or private facility capable of storing or accessing data regarding field 12 or a component thereof. For example, as described in more detail below, geographical information can be stored on a geographical information system ("GIS") server 24 and, as another example, production and/or pipeline information can be stored on a different server 26, such as a public, private or other server, in whole or in part. In at least some networks, such as exemplary network 10, one or more servers or databases can be located on or accessible by way of a different communications network from that of one or more other servers or databases. For instance, geographical information, information pertaining to production or pipelines, and/or other data may be located on a first network 28 (e.g., an extranet), while one or more other servers or databases may be located on a second network 30 (e.g., an intranet) or a third network 32 (e.g., another intranet) different from the remaining networks. Still other information may be located on or accessible via one or more other networks, including the Internet. A combined network model 34, which can, but need not, be a modified production engineering network (or version of a production engineering network) can include a combination of a plurality of networks or portions thereof for modeling an oilfield network, as described in greater detail herein.

A production engineering network can be or include a computerized model of the wells, pipelines, and processing facilities used or present in a physical oilfield network. A production engineering network normally can be implemented using software on a suitable computer system, which can, but need not, include one or more mobile devices 50, such as a phone, tablet or portable computer. Examples of commercial software for implementing production engineering networks include NEXUS®, which is a commercial software application available from Landmark Graphics Corporation, GAP®, available from Petroleum Experts, and Pipesim®, available from Schlumberger.

One or more embodiments of the present disclosure can be implemented in software applications. The software may include, for example, routines, programs, objects, components, and data structures for performing particular tasks or implementing particular data types, such as abstract or other data types. In at least one embodiment, NEXUS® can be used as an interface application, though this application is noted for illustrative purposes only, and other embodiments may employ one or more other interface applications, separately or in combination, in whole or in part. The NEXUS® or other interface(s) and implementations of the present disclosure may reside on a suitable computer system (which can be any computer or system of computers required by a particular application) having one or more computer processors, such as an Intel Xeon 5500, and computer readable storage, which may be accessible through a variety of memory media, including semiconductor memory, hard disk storage, CD-ROM and other media now known or future developed. One or more embodiments of the disclosure may also cooperate with one or more other system resources, such as Oracle® Enterprise, and suitable operating system resources, such as Microsoft® Windows®, Red Hat® or others, separately or in combination.

One or more embodiments of Applicants' disclosure can cooperate with other databases and resources available to a production engineering network(s). For example, at least one implementation may cooperate with one or more databases, such as a database accessible on the same computer, over a local data bus, or through a network connection. The network connection may be a public network, such as the Internet, a private network, such as a local area network ("LAN"), or some combination of networks. Those skilled in the art having the benefits of Applicants' description will appreciate that one or more embodiments of the disclosure may be implemented in a variety of computer-system configurations, or computer architectures. It will be appreciated that any number of computer systems and computer networks are acceptable for use in embodiments of the disclosure. Still further embodiments may be implemented in distributed-computing environments, such as where tasks are performed by remote-processing devices that may be linked through a communications network. In a distributed-computing environment, program modules may, but need not, be located in both local and remote computer-storage media, including memory storage devices or other media.

Embodiments of the disclosure may be stored on computer readable media, such as one or more hard disk drives, DVDs, CD ROMs, flash drives, or other semiconductor, magnetic or optically readable media, separately or in combination, in whole or in part. These computer storage media may carry computer readable instructions, data structures, program modules and other data representing one or more embodiments of the disclosure, or portions thereof, for loading and execution by an implementing computer system. Although one or more other internal components of a suitable computing system may not be specifically shown or described herein, those of ordinary skill in the art will appreciate that such components and their interconnection and operation are well known.

Besides a production engineering network, on the financial side of an operation, reservoir operators may rely on a production allocation network, which can be another representation of a physical network. Production allocation networks can be or include one or more software applications that may be run on computer systems and networks like one or more of the other software applications described elsewhere in the disclosure. Examples of production allocation networks include DecisionSpace® Production Allocation, available from Landmark Graphics Corporation, ADM®, available from Schlumberger, and Energy Components®, available from Tieto. These applications typically may provide an interface to one or more underlying databases, such as Oracle or another database. Although production engineering networks and production allocation networks can share similar characteristics, the level of detail and information may differ between them, and one network typically cannot be readily used as a substitute for the other.

In at least one embodiment of the disclosure, data federation techniques can be used to combine information from one or more allocation networks, separately or in combination with additional information from one or more other sources (e.g., those described below), into a production engineering network for optimizing a model of the production engineering network. This can be accomplished according to a computer implemented process that synchronizes (e.g., periodically, continuously or otherwise) the production engineering network with, for example, the most current information about a physical oilfield network available at a particular time or times of interest to a user. There are many sources of information that may be used to provide information into a production engineering network according to embodiments of the disclosure. For example, the database(s) used by Landmark Graphics Corporation's OpenWells® Engineering Data Model ("EDM"), those used by Peloton's Wellview® (MasterView), or another well drilling operational database, may provide data such as the latitude and longitude of wells in a network. Maximo® or any other facility maintenance database may provide other information, for example, the latitude and longitude of facilities in a network, such as pipelines, separators, burners, compressors or other facilities. In general, information identifying any facility that requires maintenance may be stored in a Maximo® or similar database and accessed or otherwise used by one or more embodiments of the present disclosure. Also, or alternatively, a geographical information system ("GIS"), such as ArcGIS from ESRI or a similar system, may provide elevation information for facilities, surrounding terrain, obstacles, etc. In addition, or in isolation, public data (e.g., from the IHS® Information Hub or a similar source) for a previously constructed engineering network can provide pipeline identification information ("pipeline IDs") and other data or factors, such as regarding materials (e.g., material factors, types or properties), component sizes (e.g., diameters, lengths, etc.) or associated friction factors. Of course, any or all data from a particular source can be considered or otherwise used as required or desired for a particular application of an embodiment, in whole or in part, separately or in combination, and in at least some embodiments may be used to obtain other information that may not be immediately available in a particular form or format. For example, if desired friction factor information is not explicitly included in a source database, such values can be determined from pressure losses incurred in an existing network (e.g., prior to the addition of new wells).

In at least one embodiment of the present disclosure, one or more of the various sources of information described herein can be connected together or otherwise operably coupled in a federated database system. A federated database, which also may be referred to as a virtual database or a composite database, can be or include a database composed of constituent autonomous database systems, which can include databases that may be geographically remote and included in or coupled to the federated database though a computer network, such as the Internet or another network. According to one or more embodiments, there may be no data integration in the constituent databases as a result of data federation. Rather, the federated database system of the present disclosure can link one or more sub-databases together for the purpose of obtaining information and applying the information collectively. In other words, in at least one embodiment, a federated database may not require merging the information in the constituent, or component, databases and can allow for the avoidance of such a requirement.

Of course, it will be understood by those of skill in the art having the benefits of Applicants' disclosure that the various cooperating component databases may be autonomous and heterogeneous; therefore, linking them together may include the use of data federation techniques to access the various repositories and extract from them the diverse information relevant to the same properties in a particular production network. These techniques can include, for example, use of common and unique identifiers, or translation tables. Suitable data federation techniques may also (or alternatively) include breaking an information query into smaller queries, which can be sent to the relevant constituent systems. The federated systems described herein can assemble the resulting information provided by the constituent systems by obtaining applicable information from each sub-system and modeling one or more networks based on the collective data. For example, where one or more sub-systems are implemented in different places, such as on an intranet, on different physical servers, or on the Internet (e.g., in a public or semi-private or other access), each system may typically not be moving—that is, they are evolving in content with time, but their locations (e.g., Uniform Resource Locators ("URL")) are not changing. A model of the present disclosure can be configured, such as by a systems administrator or other user, to identify or otherwise locate each sub-system and employ federation tools to query regularly those disparate sources and understand when new data has been created in order to bring it back to the federation. Because the various systems may be autonomous, they may also use different languages. A federated database may address this by, for example, applying wrappers to the queries intended for the constituent databases to translate them into the appropriate language or languages. A description of data federation techniques useful according to one or more embodiments of the disclosure can be found in U.S. Pat. No. 8,229,938 B2, though other techniques are known to those of skill in the art and can likewise be utilized in at least one embodiment of the present disclosure.

Figure 4A:
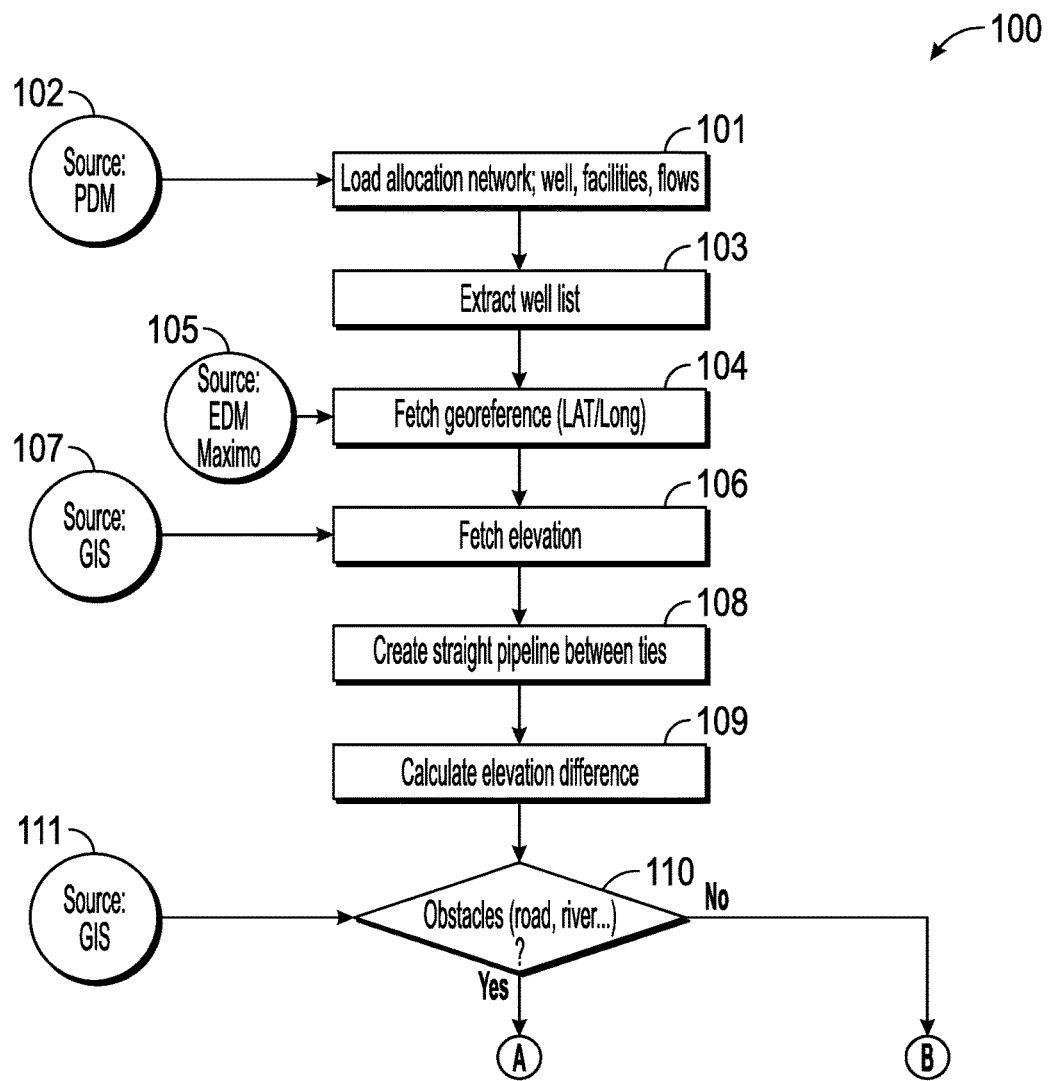
FIG. 4A is a flow diagram illustrating a method for implementing one of many embodiments of a network model according to the disclosure.
Figure 4B:
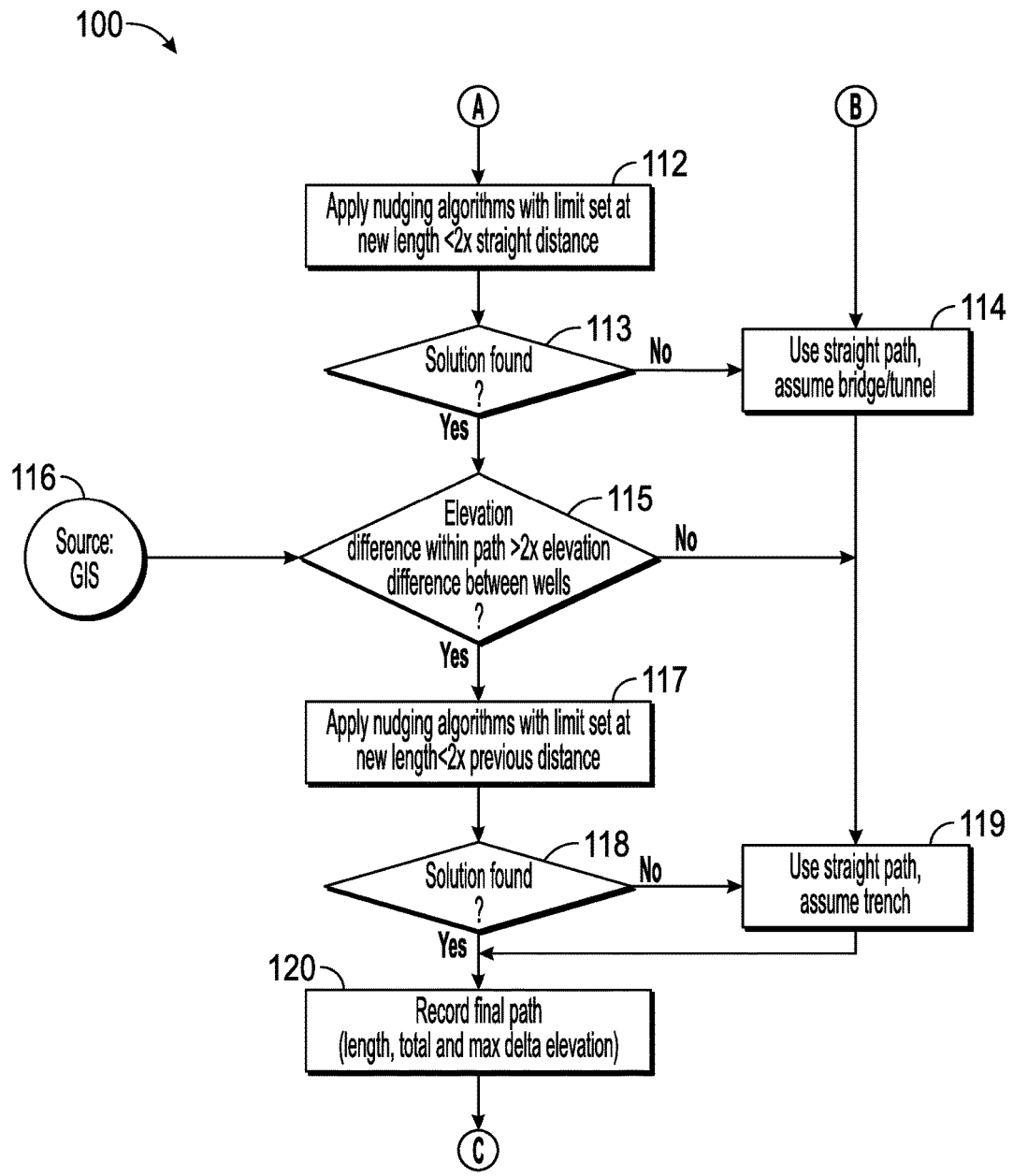
FIG. 4B is a continuation of the flow diagram of FIG. 4A.
Figure 4C:
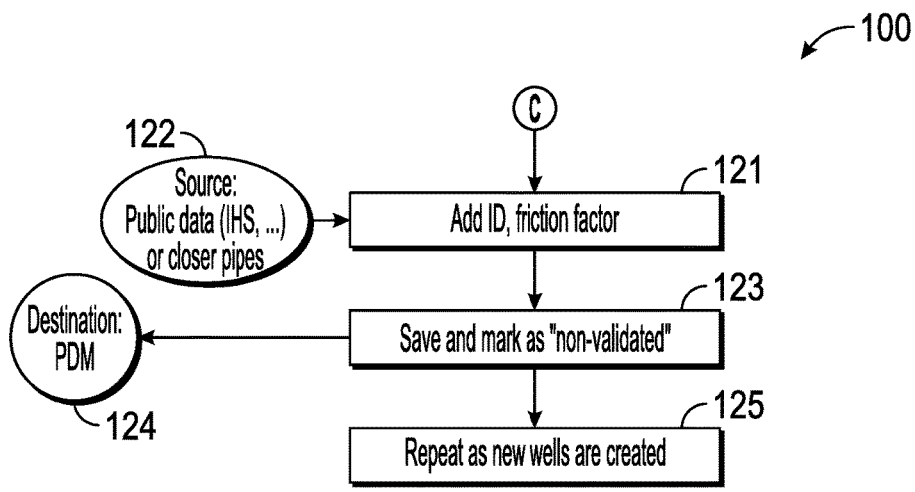
FIG. 4C is a continuation of the flow diagram of FIGS. 4A and 4B.
Figure 5:
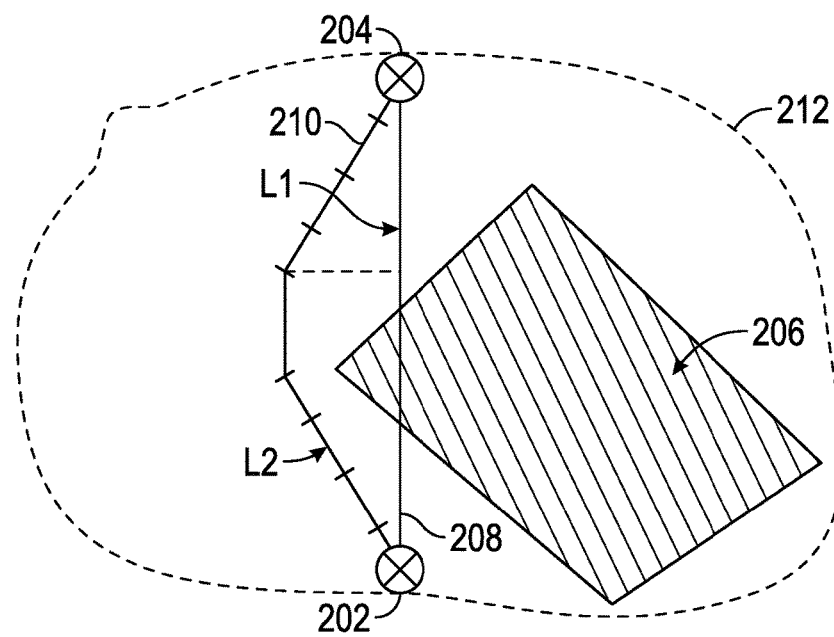
FIG. 5 is a schematic diagram illustrating an exemplary application of a nudging algorithm implemented by a network model according to the disclosure.
Figure 6:
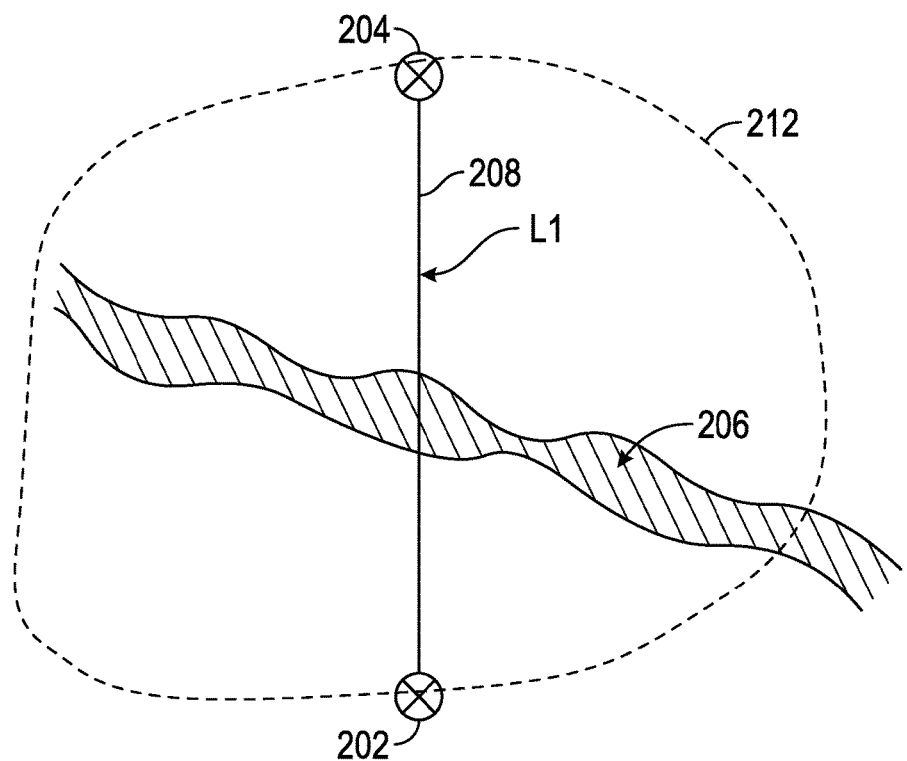
FIG. 6 is a schematic diagram illustrating another exemplary application of a nudging algorithm implemented by a network model according to the disclosure.
Figure 7:
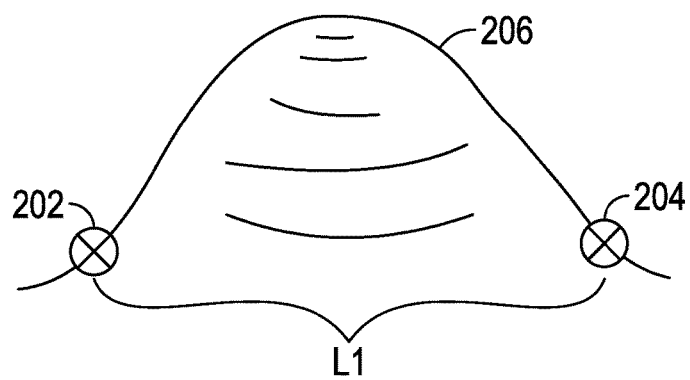
FIG. 7 is a schematic side view illustrating yet another exemplary application of a nudging algorithm implemented by a network model according to the disclosure.

Referring now to FIGS. 4A-4C and 5-11, FIG. 4A is a flow diagram illustrating a method for implementing one of many embodiments of a network model according to the disclosure. FIG. 4B is a continuation of the flow diagram of FIG. 4A. FIG. 4C is a continuation of the flow diagram of FIGS. 4A and 4B. FIG. 5 is a schematic top view illustrating an exemplary application of a nudging algorithm implemented by a network model according to the disclosure. FIG. 6 is a schematic top view illustrating another exemplary application of a nudging algorithm implemented by a network model according to the disclosure. FIG. 7 is a schematic side view illustrating yet another exemplary application of a nudging algorithm implemented by a network model according to the disclosure. FIG. 8 is a schematic top view of the exemplary application of a nudging algorithm of FIG. 7. FIG. 9 is a schematic side view of the exemplary application of a nudging algorithm of FIGS. 7-8. FIG. 10 is a schematic top view of the exemplary application of a nudging algorithm of FIGS. 7-9. FIG. 11 is a schematic side view of the exemplary application of a nudging algorithm of FIGS. 7-10. FIGS. 4A-11 will be described in conjunction with one another. In block 101, a production engineering network model 100 can load or otherwise incorporate information from an allocation network (e.g., information regarding wells, facilities, flows, etc.) into the production engineering network's (or combined network's) own network database. In at least one embodiment, which is but one of many, the allocation network information can be stored in a Production Data Model ("PDM") 102, such as a model that stems from production volume management tracking. A PDM can, but need not, include all the relevant information (e.g., the data described herein) for a full tracking of one or more integrated production assets. In at least one embodiment, a PDM can be or comprise at partially a subset of a one or more other models, such as a model defined or otherwise provided by the Professional Petroleum Data Management (PPDM) Association (a "PPDM model"), separately or in combination with one or more additional pieces of information, which can be added, for example, in order to get a desired level of details for one or more components of a surface and/or sub-surface system. A PDM can include any information related to one or more allocation networks, such as information that identifies one or more wells in a network, one or more facilities in the network or, as another example, one or more hydrocarbon flows in the network. In at least one embodiment, a PDM, or PDM system, can provide information through a computer network communication, such as via an Internet or other network transmission to the production engineering network model 100. Alternatively, or collectively, some or all of the information can be provided by a wholly or partially private or proprietary LAN or WAN Ethernet, a USB or similar communication channel or, as another example, can be downloaded onto a storage medium, such as a flash drive or hard drive, and manually downloaded, uploaded or otherwise communicated to production engineering network model 100. In at least one embodiment, the information from PDM 102 (or any portion thereof) can be compared and/or combined with the network information already present (if any) in production engineering network model 100. Such information, as well as any information from one or more of the other virtual and physical databases described herein, can be analyzed, synchronized and/or merged with the network information already present in production engineering network model 100 in any manner required by a particular application, including being analyzed for duplicate or conflicting information and processed according to applicable instructions.

The analysis, synchronization, comparison and merges of virtual and physical databases can, but need not, follow one or more structures that those skilled in the art will recognize, such as those used in one or more known Document Management Systems (or similar), and/or implemented by various commercial database providers (e.g., Microsoft® Synch® in Structured Query Language ("SQL")).

In block 103, production engineering network model 100 can extract one or more well lists from the network database. This information can contain or include a list of all wells (which can be any number, such as one or more wells) in a network, including those directly entered into a network database through production engineering network computer software and/or those obtained from PDM 102 or another allocation network system. A well list can include any well information required by a particular application of one or more embodiments, such as, for example, the name of each well in the list and the date when each well was created, whether physically, in the model or system itself, or both. In at least one embodiment, which is but one of many, one or more dates associated with a well can be used as markers, for example, to identify a new or otherwise different or unknown well from or in comparison to one or more other or otherwise known wells, such as one or more wells identified as present during the last (i.e., most recent) comparison exercise. A well name can, but need not, be a key recognition element, and can, but need not, be supplemented or associated with one or more other well or equipment identifiers, such as unique identifier (e.g., an American Petroleum Institute ("API") number or other identifier).

After extracting the well list (or at another time require by a particular application), model 100 can determine or otherwise recognize a geographical location of one or more wells in a network, including for each well in a network. In block 104, the production engineering network model 100 can query one or more sources, such as an EDM, Maximo® or another source, for location information, such as latitude and longitude values, coordinates, or other location identifiers. One or more queries can be sent to appropriate databases over a suitable network connection, for example, the Internet. In response, the database(s) can provide or otherwise make available the geographical data identifying or otherwise defining the location (e.g., latitude and longitude) of each well in a list, which can include any number of wells, well sites, or collections thereof. The production engineering network model 100 can then be provided with or otherwise obtain elevation(s) data for each (or selected ones) of the wells or well locations.

Work flow can proceed, for example, to block 106 where model 100 can query one or more geographic information sources, such as a GIS system 107, for elevation information relating to one or more wells or other components of a production engineering network system, such as wellheads and facilities, among others. In at least one embodiment, which is but one of many, geographic information can be included in and/or obtained from one or more sources other than GIS system 107, such as from an EDM, separately or in combination, in whole or in part. However, because such details may not always be present or accurate in a single source, model 100 can compare or otherwise analyze data from two or more different sources, for example, to double-check or otherwise verify the completeness or accuracy of information or sets of information. Typically, for information such as geographical data, a proper GIS system can have the advantage of internal consistency as compared to other types of sources, which can make such a GIS system a preferred source for such information in one or more embodiments. For things like facilities, GIS systems can in some circumstances be the only source from which certain elevation information can be obtained, although this need not always be the case. GIS system 107 can, but need not, be one of many GIS systems known in the industry or one or more other industries (e.g., the defense industry), and can alternatively (or collectively) be or include one or more GIS systems developed specifically for use by or with model 100. For example, in at least one embodiment of the present disclosure, elevation values may not matter as much as differences in elevations for purposes of model 100. Consequently, in one or more embodiments, model 100 can receive or otherwise obtain one or more differences in elevations from a GIS system.

In block 108, production engineering network model 100 can create a straight or other pipeline using links or "ties" as defined by an allocation network and using the locations of each of the wells obtained in block 104. One purpose of an allocation network can be to draw or otherwise create a diagram tying a point(s) of sale(s) back to individual reservoir sources flowing through a system, such as a complex or other set of wells and facilities. As such, the links or ties between each tying point in such a diagram can be codified in a database, for instance, via the inclusion of a simple list in the data structure of each element, which can include explicitly adding a one to many relationship from each point to its possible ties. Production engineering network model 100 model, for example in block 109, can calculate elevation differences (which can be any difference, including no difference (e.g., a value of 0)) between two or more tying points in the pipeline model created in block 108. Using this information, the production engineering network model 100 can analyze the performance of a corresponding or underlying physical network. While this alone can be considered an improvement on a production engineering network that does not take into account such additional wells and facilities at all, it can be desirable to even further increase the accuracy of one or more assumptions used by a production engineering network. Therefore, in at least one embodiment, production engineering network model 100 can account for likely or other variations in the actual, physical network by taking advantage of terrain information from a GIS system, which can include employing one or more nudging algorithms or operations to adjust the model appropriately. Nudging (also known by some as Newtonian relaxation or 4DDA) can be essentially the same as proceeding in continuous time rather than in discrete analysis cycles, and typically can include imputing simplified covariance to an analysis. One or more examples of nudging in the context of the present disclosure are described in more detail below.

In block 110, flow can proceed to a decision tree, which can include a tree in which production engineering network model 100 can obtain information regarding geographical obstacles (if present), such as roads or rivers, from one or more databases or other sources, such as GIS system 111. It should be noted that reference numeral 111 is intended to refer to a process step for production engineering network model 100, and does not imply that a physically separate GIS database must be accessed (although this can be the case in one or more embodiments). In other words, GIS system 111, as with one or more of the other databases discussed herein, may be or include the same or a different database(s) as the one(s) referred to elsewhere herein (e.g., GIS system 107), depending on factors such as the architecture of a particular network and where relevant information may be physically stored, among others. It will be appreciated by those skilled in the art that the production engineering networks disclosed herein are intended to be flexible, for example, so as to incorporate useful data wherever such data may be stored using data federation techniques and the other systems and methods described herein, separately or in combination, in whole or in part, as required or desired for a particular embodiment or application thereof. With continuing reference to block 110, production engineering network model 100 can check or otherwise compare the geographical locations of one or more straight pipeline paths created in blocks 108 and 109 against the geographical locations of one or more obstacles (if present) and can determine if one or more of the paths may be impeded by an obstacle(s). If not, then work flow can proceed to block 114; if, however, a pipeline path is blocked by an obstacle, then flow can proceed to block 112, as further described below.

With continuing reference to the Figures and specific reference to FIGS. 4B and 5-11, production engineering network model 100 (e.g., in block 112) can apply one or more nudging algorithms designed or otherwise adapted to take into account a length of pipeline, such as an additional length of pipeline necessary to or capable of navigating one or more obstacles, such as roads, rivers, hills, protected or populated land, etc. In at least one embodiment, a nudging algorithm can increase a length of a pipeline by an incremental amount (which can be any amount required by a particular application) and (e.g., in block 113) determine whether such an additional pipeline length would be sufficient to navigate the obstacle(s) in question. As shown in FIG. 5 for illustrative purposes, take, for example, a physical oilfield network including a well 202 and a separator 204 separated by a straight line distance of L1, yet situated on opposite sides of at least a portion of an obstacle 206 such that a pipeline 208 of length L1 cannot realistically be used to couple the well and separator. In at least one embodiment, model 100 can recognize such a physical arrangement and apply a nudging algorithm to adjust (e.g., increase, in this context of the present example) the length of pipeline 208 sufficiently to circumvent obstacle 206, which can result in a solution (e.g., rerouted pipeline 210 having length L2) that more closely tracks a physical network represented by model 100. Model 100 can, but need not, include one or more limits 212 within which such a solution must be found, such as, for example, a maximum adjustment for the length of a pipeline. In at least one embodiment, if model 100 cannot determine a solution within applicable limits (if present), model 100 can ignore the variance and proceed as if a pipeline having a length equal to an applicable straight line distance (e.g., L1 in the example of FIG. 5) were present. Such a scenario is illustrated in FIG. 6, where well 202 and separator 204 are disposed on opposite sides of a different obstacle 206 (e.g., a river or road) that may prevent model 100 from determining a solution within limits 212 as defined by a user.

One or more nudging algorithms applied by model 100 can, but need not, be one of many nudging algorithms known in the industry (or one or more other industries), and can alternatively (or collectively) be or include one or more nudging algorithms developed, modified or otherwise adapted specifically for use by or with model 100, in whole or in part. In at least one embodiment, such as an embodiment including block 112, which is but one embodiment of many, the application of a nudging algorithm can, but need not, include setting one or more limits (e.g., as described above). For example, a pipeline length can be limited by defining a maximum length or change in length, which can be any length or change in length required by a particular application. Of course, it will be appreciated that a nudging algorithm in one or more embodiments can rely on engineering or other assumptions from information in an allocation network, which in some cases may not include the relatively more detailed "as built" information that may normally be entered into or otherwise present in a production engineering network. Therefore, one or more precautions can, but need not, be taken by or within at least one embodiment of model 100. For example, if an embodiment of production engineering network model 100 is unable to find or otherwise determine a solution to avoid an obstacle within a reasonable increase in pipeline length, which can be any increase in pipeline length, such as a predetermined value applicable for a network at hand, then in at least one embodiment, model 100 can increase the length of a pipeline (or pipelines) in the network model to a reasonable value. In the embodiment of model 100 shown for illustrative purposes, which is but one of many, if no solution is found the length of a pipeline can be set, for example, at twice the length of the straight line distance. Although, this need not be the case and, of course, it will be appreciated that adjusting such a value is within the skill of those in the art having the benefits of the present disclosure and that such ordinarily skilled persons can make these and other assumptions as conservatively or as loosely as desired. As another example, in one or more other embodiments, if no solution is found within a pipeline length limitation, one or more obstacles may be ignored. In other words, model 100 can be adapted to assume that a pipeline follows a straight path (e.g., through a trench) by, for example, running through a bridge, tunnel, land mass or other structure or obstacle, in which case flow can proceed to block 114 as shown for exemplary purposes in FIG. 4B.

If a solution is found, then production engineering network model 100 can take into account any change(s) in elevation that may be present in calculating or otherwise modeling a corresponding pipeline. In block 115, production engineering network model 100 can determine whether there is an overall elevation difference between the ends of a pipeline that is greater than an amount defined by an operator. Again, this amount can be selected as a design preference and can be or include any value(s) required by a particular application. Take, for example, two physical network components separated by an obstacle 206 of considerable height above ground level (e.g., a landmass, such as a hill or mountain), as shown for illustrative purposes in FIGS. 7-8. For purposes of convenience, and not limitation, well 202 and separator 204 (separated by straight line distance L1) are once again used as examples, and are shown to be disposed at the same elevation, although this need not be the case. Model 100 can determine a length (L2) of a pipeline 208 sufficient to couple well 202 and separator 204 if routed directly between the components but over obstacle 206 (see FIG. 9). Model 100 can then determine whether length L2 exceeds applicable limits (if present). In at least one advantageous embodiment, production engineering network model 100 can determine whether an overall elevation difference is greater than twice the elevation difference between a plurality of wells or other components connected by one or more pipelines, but this is only one embodiment of many. If L2 (or the difference between L1 and L2) is less than a defined limit, production engineering network model 100 work flow can proceed to block 119 and model 100 can assume that the pipeline at hand runs through a tunnel or trench. That is, model 100 can, but need not, use a corresponding straight path length, e.g., as determined in block 113 or block 114. If the elevation difference is greater than the limit (which can be any limit), then production engineering network model 100 may use a nudging algorithm (see block 117), such as an algorithm similar to the one described above with reference to block 112, to reduce one or more elevation changes to an acceptable value, such as by finding one or more alternate pipeline paths, such as a path 214 (see FIG. 10) that would circumvent the obstacle by traveling at least partially around it or a path 216 (see FIG. 11) that would be of a more constant slope (i.e., limited change in elevation as increase in total length). Turning to block 118, if no solution is found, then a pipeline length may be set at or to a predetermined length, such as, for example, twice the length determined in block 113 or block 114. However, this need not be the case and, in one or more other embodiments, the elevation difference can be ignored and flow can proceed to block 119.

With continuing reference to FIG. 4B, in block 120 a final path for one or more pipeline models created by production engineering network model 100 can be recorded in a production engineering network database, which can include recording or saving any data required by a particular application, such as length, total elevation and change in elevation (e.g., max delta elevation). It will be recognized by those skilled in the art that a production engineering network can, and in at least some cases likely will, contain numerous pipelines, and that the methods and systems described above with regard to the exemplary embodiments shown in the figures can be repeated (in whole or in part, as the case may be) to create a computer model for each physical pipeline within a system, which can include creating one or more computer models for each physical pipeline added to an existing system as or at the time such pipeline is added to an actual system being modeled. Model 100 can account for non-pipeline components of a system (e.g., tanks, compressors, etc.) in a manner similar to that described herein regarding pipelines. In other words, within model 100, each system or network component can be considered or otherwise modeled as a tying point, whether the component is a pipeline or otherwise.

With continuing reference to the figures and specific reference to FIG. 4C, once a pipeline model (or model portion) is created, flow can proceed to one or more other aspects of an embodiment of model 100. For example, in block 121, production engineering network model 100 can obtain, add or otherwise include one or more additional factors pertaining to one or more pipelines or other components, such as well IDs and pipeline friction factors. Data relating to such additional factors can be obtained from one or more data sources 122, such as, for example, a public data source or a data source containing known information from one or more other pipelines in the system and/or relatively close to the pipeline created by model 100. Such information can be obtained or accessed in any manner required by a particular application, such as over a network communication or otherwise. This information can be used to calculate one or more operating parameters of a system, such as overall system pressure drop between wells and points of sale. As another example, such data can be used by model 100 to calculate friction factors in one or more sections of a system, and can, but need not, be saved for later use, such as to be reused later for new wells and/or links as default values in one or more future or other models.

In at least one embodiment, production engineering network model 100 work flow can proceed to, for example, block 123, where model 100 can save any or all information about a newly created, updated, or otherwise modified or changed pipeline or network in a database or other storage destination 124 (e.g., as or in a PDM). In one or more embodiments, production engineering network model 100 can mark or otherwise define or be directed to define a pipeline or system as "non-validated" or something similar, such as to indicate that the pipeline model was wholly or partially created using estimates based on, for example, federation of data from an allocation network, and not from the actual drawings (e.g., engineering or Computer Assisted Design ("CAD") drawings) for the underlying physical pipeline. Nevertheless, a model created according to one or more embodiments of the disclosure can account for all wells in a network, which can include modeling a network in a manner that is at least partially more accurate or useful than one or more conventional methods or systems. As new wells come online, flow of model 100 can proceed to block 125, and the processes described herein with regard to blocks 101-124 can be repeated, in whole or in part, as the case may be, to keep one or more production engineering network models updated at a particular time or over a desired period of time.

One or more embodiments of the present disclosure can provide a method to accomplish a dedicated conversion between two or more models of different purposes and contents, but each being a computer representation of the same physical asset(s). One or more embodiments can provide one or more approximate solutions, such as by estimating what some parameters might actually be, based on historical or physical references, properties or values. Therefore, it can be useful to validate one or more production engineering network models by incorporating within the production engineering model one or more as-built diagrams representing physical network components. However, as described above, the pipelines created by production engineering network model 100 may be designated as "unverified" or some similar designation in a database to inform engineers or others that such model was created by the system and not entered directly (e.g., by a user having actual data in-hand).

In at least one embodiment, a computer implemented method of modeling an oilfield network can include receiving information identifying a well and a tying point in the oilfield network, receiving longitude and latitude information reflecting a geographical location for each of the well and the tying point, receiving information reflecting a geographical elevation for each of the well and the tying point, creating, in computer readable storage, a pipeline along a first path between the well and the tying point, the first path being a straight line between the geographical locations of the well and the tying point, defining a length of the first path, the first path length being a length of the straight line, calculating an elevation difference between the well and the tying point, determining whether an obstacle exists in the first path, and defining a length of the pipeline. In at least one embodiment, a tying point can include a device adapted to modify flow properties of fluid in a pipeline or network, such as a well, facility, compressor, pipeline, separator, burner or junction. In at least one embodiment, defining a path length can comprise ignoring an elevation difference between two tying points or accounting for the elevation difference between two tying points, such as by increases a length to account for a difference in elevation over a distance. In at least one embodiment, if no obstacle exists in a path, a pipeline length can remain unchanged from a length of the path and a method can include determining that no obstacle exists in a path and defining a length of a pipeline as the path length. In at least one embodiment, a computer implemented method can include determining that an obstacle exists in a path, creating a second path that partially or wholly circumvents the obstacle or a portion thereof, and adjusting a length of a pipeline to equal or otherwise relate to a length of the second path, such as a length less than or greater than a length of a first path. In at least one embodiment, a computer implemented method can include implementing one or more nudging algorithms and adjusting the length of a pipeline by way of the one or more algorithms. A method can include defining a maximum or other limit for adjusting a length of a pipeline, such as a limit beyond which the length of the pipeline cannot be adjusted.

A method can include calculating an elevation difference along a path and comparing the elevation difference along the path to an elevation difference between two or more tying points, which can be any components in an oilfield or other network. A method can include communicating with one or more computer accessible databases, such as a database containing information reflecting one or more other pipelines in a network. A database can contain information reflecting the "as built" or actual physical configuration of a pipeline or other components in a network, and a method can include creating, such as in computer readable storage, one or more pipelines based on all or part of the as built information. A method can include receiving or otherwise having, obtaining or coming to have information, including information or data reflecting a friction factor or other factors for a pipeline in an oilfield network, and can include assigning one or more factors or other data to a pipeline created in computer readable storage, such as a pipeline or other network model.

In at least one embodiment, a method of generating a computer representation of a physical facility for use with a computer model of an oilfield network can include accessing a database and retrieving location information including the geographical latitude and longitude of a physical facility to be added to the model, creating a computer representation of a pipeline between the facility and a tying point in the model, the pipeline having a length, accessing a database and retrieving elevation information including the geographical elevation of the facility and the geographical elevation of the tying point, calculating an elevation difference between the facility and the tying point, accessing a database, retrieving geographical information and identifying an obstacle that exists between the facility and the tying point based on the geographical information, identifying the elevation, latitude and longitude of the obstacle, incrementally adjusting the length of the pipeline until a solution is determined to avoid the obstacle or until an adjustment limit is reached, accessing a database, retrieving at least one factor attributed to a physical object in the oilfield network and assigning the at least one factor to the pipeline, and synchronizing the computer model with the computer representation of the pipeline. A method can include assigning to the pipeline at least one of a friction factor, a material type, a material property and a size, such as a size of one or more components of the pipeline. A method can include executing one or more nudging algorithms to adjust the length of the pipeline, including for increasing or decreasing the pipeline length. A method can include establishing a federation of two or more databases, such as by creating one or more federated databases.

In at least one embodiment, a computer readable medium can have instructions stored thereon that, when executed by a processor, can cause the processor to perform a method comprising obtaining information identifying a well and a tying point in an oilfield network, obtaining longitude and latitude information reflecting a geographical location for each of the well and the tying point, obtaining information reflecting a geographical elevation for each of the well and the tying point, creating, in computer readable storage or other media, a pipeline along a first path between the well and the tying point, the first path representing a straight line between the geographical locations of the well and the tying point as represented in a computer model, defining a length of the first path, the first path length being a length of the straight line, calculating an elevation difference between the well and the tying point in the network, determining whether an obstacle exists in the first path, and defining a length of the pipeline. A straight line length or distance can, but need not, be the shortest distance between two points, such as depending on whether such points are modeled in or otherwise considered to be in the same plane (e.g., a horizontal place or other, non-horizontal plane). A computer readable medium can have instructions stored thereon that, when executed by a processor, can cause the processor to perform a method including determining that one or more obstacles exist in a path, creating one or more other paths, such as a second path, that at least partially circumvent the one or more obstacles or portions thereof, and adjusting a length of a pipeline to equal or otherwise relate to a length of the one or more other paths, which can include a second, third, fourth, fifth or other path. A computer readable medium can have instructions stored thereon that, when executed by a processor, can cause the processor to perform a method comprising incrementally adjusting a length of a pipeline until a solution is determined to avoid one or more obstacles in a path or until an adjustment limit is reached. A method can include executing one or more nudging algorithms, and can include calculating one or more elevation differences along one or more paths and comparing the elevation differences to an elevation difference between two or more network components, such as a well and one or more other tying points. A method can include receiving information from a federation of two or more databases.

In at least one embodiment, a system for modeling an oilfield network can include one or more oilfield components, such as wells, facilities, pipelines and other links, treatment devices, junctions, valves, tanks, compressors, pumps, and other components, and one or more communication paths, such as a wired or wireless network, for communicating information regarding at least a portion of the oilfield network from one place to one or more other places, automatically, manually, periodically, with or without prompting, or otherwise. A system can include one or more databases, servers, software packages, transmitters, receivers, computer readable storage media and other computer or networking components, separately or in any combination required by a particular application. A system can include one or more GIS servers and one or more public information servers, which can, but need not, serve data to systems on a local area network (LAN) or a wide area network (WAN) over the Internet. A system can include one or more private (in whole or in part) information servers, which can, but need not, serve data to systems on a local area network (LAN) or a wide area network (WAN) over the Internet. A system can include one or more databases in communication with one or more servers, such as GIS databases, public information databases, and private information databases (e.g., production allocation databases, production engineering databases). A system can include one or more electronically stored computer models representing one or more oilfield components in an oilfield network, such as a computer model adapted to receive and/or analyze information regarding an oilfield network and to generate one or more solutions or approximations based on such information. A system can include one or more computer models including one or more nudging algorithms. A system can include a federation of one or more databases, which can, but need not, include one or more sub-systems adapted to retrieve or otherwise obtain or receive information (i.e., data) from a plurality of databases (e.g., constituent databases) without copying or permanently modifying the data as it exists on each database.

Other and further embodiments utilizing one or more aspects of the systems and methods described above can be devised without departing from the spirit of Applicants' disclosures. For example, the systems and methods disclosed herein can be used alone or to form one or more parts of another modeling, simulation or other analysis system. Further, the various methods and embodiments of the workflow system can be included in combination with each other to produce variations of the disclosed methods and embodiments. Discussion of singular elements can include plural elements and vice-versa. References to at least one item followed by a reference to the item may include one or more items. Also, various aspects of the embodiments could be used in conjunction with each other to accomplish the understood goals of the disclosure. Unless the context requires otherwise, the word "comprise" or variations such as "comprises" or "comprising," should be understood to imply the inclusion of at least the stated element or step or group of elements or steps or equivalents thereof, and not the exclusion of a greater numerical quantity or any other element or step or group of elements or steps or equivalents thereof. The device or system may be used in a number of directions and orientations. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

As will be appreciated by those skilled in the art, one or more embodiments of the present disclosure may be embodied as a method, data processing system, or computer program product. Accordingly, at least one embodiment may take the form of an entirely hardware embodiment, an entirely software embodiment, or an embodiment combining software and hardware aspects. Furthermore, at least one embodiment may be a computer program product on a computer-usable storage medium having computer readable program code on the medium. Any suitable computer readable medium may be utilized including, but not limited to, static and dynamic storage devices, hard disks, optical storage devices, and magnetic storage devices.

At least one embodiment may be described herein with reference to flowchart illustrations of methods, systems, and computer program products according to the disclosure. It will be understood that each block of a flowchart illustration, and combinations of blocks in flowchart illustrations, can be implemented by computer program instructions. These computer program instructions may be provided to a processor of a general purpose computer, special purpose computer, or other programmable data processing apparatus to produce a machine, such that the instructions, which can execute via a processor of a computer or other programmable data processing apparatus, can implement the functions specified in the flowchart block or blocks, separately or in combination, in whole or in part.

The computer program instructions may be stored in a computer-readable memory that can direct a computer or other programmable data processing apparatus to function in a particular manner, such that the instructions stored in the computer-readable memory result in an article of manufacture including instructions which can implement the function(s) specified in the flowchart block or blocks. The computer program instructions may be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

While the disclosed embodiments have been described with reference to one or more particular implementations, those skilled in the art will recognize that many changes may be made thereto without departing from the spirit and scope of the description and that obvious modifications and alterations to the described embodiments are available. Accordingly, each of these embodiments and obvious variations thereof is contemplated as falling within the spirit and scope of the disclosure and, in conformity with the patent laws, Applicants intend to fully protect all such modifications and improvements that come within the scope or range of equivalents of the following claims.

What is claimed is:

1. A computer implemented method of modeling an oilfield network, comprising:
receiving information identifying a well and a tying point in the oilfield network;
receiving longitude and latitude information reflecting a geographical location of the well and a geographical location of the tying point;
receiving information reflecting a geographical elevation of the well and a geographical elevation of the tying point;
creating, in computer readable storage, a computer representation of a pipeline along a first path between the well and the tying point, the first path being a straight line between the geographical location of the well and the geographical location of the tying point;
defining a length of the first path, the first path length being a length of the straight line;
calculating an elevation difference between the well and the tying point; determining whether an obstacle exists in the first path;
defining a length of the pipeline;
calculating an elevation difference along the first path;
comparing the elevation difference along the first path to the elevation difference between the well and the tying point; and
adjusting the length of the created computer representation of the pipeline using a nudging algorithm based on the geographical location of the well and the geographical location of the tying point to synchronize the created computer representation of the pipeline with a length of a pipeline in the oilfield network.

2. The method according to claim 1, wherein the tying point comprises a device adapted to modify flow properties of fluid in the pipeline.

3. The method according to claim 1, wherein defining the first path length further comprises either ignoring the elevation difference or accounting for the elevation difference.

4. The method according to claim 3, further comprising determining that no obstacle exists in the first path and defining the length of the pipeline as the first path length.

5. The method according to claim 1, further comprising determining that an obstacle exists in the first path, creating a second path that at least partially circumvents the obstacle, and adjusting the length of the pipeline to equal a length of the second path.

6. The method according to claim 1, further comprising defining a maximum limit beyond which the length of the pipeline cannot be adjusted.

7. The method according to claim 1, further comprising communicating with a computer accessible database containing information reflecting at least one other pipeline in the oilfield network, wherein the information reflecting the at least one other pipeline reflects as built information, and creating, in computer readable storage, a second pipeline based on the as built information.

8. The method according to claim 1, further comprising receiving information reflecting a friction factor for a physical pipeline in the oilfield network and assigning the friction factor to the pipeline created in computer readable storage.

9. A method of generating a computer representation of a physical facility for use with a computer model of an oilfield network, comprising:
accessing a database and retrieving location information including the geographical latitude and longitude of a physical facility to be added to the model;
creating a computer representation of a pipeline along a first path between the facility and a tying point in the model, the pipeline having a length;
accessing a database and retrieving elevation information including the geographical elevation of the facility and the geographical elevation of the tying point;
calculating an elevation difference between the facility and the tying point;
accessing a database, retrieving geographical information and identifying an obstacle that exists between the facility and the tying point based on the geographical information;
identifying the elevation, latitude and longitude of the obstacle;
incrementally adjusting the length of the pipeline until a solution is determined to avoid the obstacle or until an adjustment limit is reached;
calculating an elevation difference along the first path;
comparing the elevation difference along the first path to the elevation difference between the facility and the tying point;
accessing a database, retrieving at least one factor attributed to a physical object in the oilfield network and assigning the at least one factor to the pipeline; and
adjusting the length of the created computer representation of the pipeline using a nudging algorithm based on the geographical location of the well and the geographical location of the tying point to synchronize the created computer representation of the pipeline with a length of a pipeline in the oilfield network.

10. The method according to claim 9, further comprising assigning to the pipeline at least one of a friction factor, a material type, a material property and a size.

11. The method according to claim 9, further comprising establishing a federation of two or more databases.

12. A non-transitory computer readable medium having instructions stored thereon that, when executed by a processor, cause the processor to perform a method comprising:
obtaining information identifying a well and a tying point in an oilfield network;
obtaining longitude and latitude information reflecting a geographical location of the well and a geographical location of the tying point;
obtaining information reflecting a geographical elevation of the well and a geographical elevation of the tying point;
creating, in computer readable storage, a computer representation of a pipeline along a first path between the well and the tying point, the first path representing a straight line between the geographical location of the well and the geographical location of the tying point as represented in a computer model;
defining a length of the first path, the first path length being a length of the straight line;

calculating an elevation difference between the well and the tying point in the network;
determining whether an obstacle exists in the first path;
defining a length of the pipeline;
calculating an elevation difference along the first path;
comparing the elevation difference along the first path to the elevation difference between the well and the tying point; and
adjusting the length of the created computer representation of the pipeline using a nudging algorithm based on the geographical location of the well and the geographical location of the tying point to synchronize the created computer representation of the pipeline with a length of a pipeline in the oilfield network.

13. The computer readable medium according to claim 12, further comprising determining that an obstacle exists in the first path, creating a second path that at least partially circumvents the obstacle, and adjusting the length of the pipeline to equal a length of the second path.

14. The computer readable medium according to claim 12, further comprising incrementally adjusting the length of the pipeline until a solution is determined to avoid an obstacle in the first path or until an adjustment limit is reached.

15. The computer readable medium according to claim 12, further comprising receiving information from a federation of two or more databases.

* * * * *